(12) United States Patent
Salomon (10) Patent No.: US 8,817,377 B2
(45) Date of Patent: Aug. 26, 2014

(54) LIGHT COLLECTION SYSTEM AND METHOD

(75) Inventor: Yair Salomon, Jerusalem (IL)

(73) Assignee: Sunboost Ltd, Jerusalem (IL)

( * ) Notice: Subject to any disclaimer, the term of this patent is extended or adjusted under 35 U.S.C. 154(b) by 0 days.

(21) Appl. No.: 13/320,429

(22) PCT Filed: May 13, 2010

(86) PCT No.: PCT/IL2010/000382
§ 371 (c)(1),
(2), (4) Date: Nov. 14, 2011

(87) PCT Pub. No.: WO2010/131250
PCT Pub. Date: Nov. 18, 2010

(65) Prior Publication Data
US 2012/0092772 A1    Apr. 19, 2012

Related U.S. Application Data

(60) Provisional application No. 61/178,070, filed on May 14, 2009, provisional application No. 61/253,076, filed on Oct. 20, 2009.

(51) Int. Cl.
*E04B 5/46* (2006.01)
*E04B 2/02* (2006.01)
*E04C 1/40* (2006.01)
*E04C 1/42* (2006.01)
*E04C 2/54* (2006.01)

(52) U.S. Cl.
CPC ............. *E04B 5/46* (2013.01); *E04B 2002/023* (2013.01); *E04C 1/40* (2013.01); *E04C 1/42* (2013.01); *E04C 2/54* (2013.01)
USPC .......................................... 359/598

(58) Field of Classification Search
CPC ...................................................... F21S 10/005
USPC .................. 126/569, 663, 684–685; 136/246; 359/457, 589, 591–598
See application file for complete search history.

(56) References Cited

U.S. PATENT DOCUMENTS 4,316,448 A * 2/1982 Dodge ........................... 126/600
4,329,978 A * 5/1982 Wormser et al. .............. 126/684

(Continued)

OTHER PUBLICATIONS

International Search Report for PCT/IL2010/000382, dated Sep. 29, 2010.

*Primary Examiner* — Clayton E LaBalle
*Assistant Examiner* — Kevin Butler
(74) *Attorney, Agent, or Firm* — Smith Risley Tempel Santos LLC; Gregory Scott Smith (57) ABSTRACT

The present invention is directed to light collection systems, the system comprising at least one light receiving element, selected from the group consisting of: a window, a photovoltaic element, a heating element, a light guiding element and combinations thereof, and at least one light reflector-deflector element, each element comprising a front light receiving surface, a rear surface, and a transparent volume, disposed between the front light receiving surface and the rear surface, the transparent layer being of a higher refractive index than of its surrounding, wherein the transparent volume comprises an asymmetric pattern which is configured to at least partially reflect light by internal reflection and direct the light within the element, reflect some light off said front light receiving surface, reflect, deflect and guide light within the light reflector-deflector element; and direct light through the front light receiving surface towards the at least one light receiving element.

16 Claims, 8 Drawing Sheets

(56) References Cited

U.S. PATENT DOCUMENTS

| | | | |
|---|---|---|---|
| 4,335,708 A * | 6/1982 | Holter et al. | 126/676 |
| 4,800,868 A * | 1/1989 | Appeldorn et al. | 126/692 |
| 6,971,756 B2 * | 12/2005 | Vasylyev et al. | 359/852 |
| 8,450,603 B2 * | 5/2013 | Tadayon et al. | 136/259 |
| 2002/0075579 A1 * | 6/2002 | Vasylyev et al. | 359/853 |
| 2004/0079358 A1 | 4/2004 | Arkas et al. | |
| 2005/0166952 A1 * | 8/2005 | Ransquin et al. | 136/246 |
| 2008/0190413 A1 * | 8/2008 | Grochola | 126/623 |
| 2008/0271776 A1 * | 11/2008 | Morgan | 136/246 |
| 2009/0255568 A1 * | 10/2009 | Morgan | 136/246 |
| 2011/0067748 A1 * | 3/2011 | Pfeiffer | 136/246 |
| 2011/0096426 A1 * | 4/2011 | Ghosh et al. | 359/853 |
| 2011/0101253 A1 * | 5/2011 | Lal et al. | 250/505.1 |
| 2011/0197877 A1 * | 8/2011 | Virk | 126/623 |
| 2012/0019942 A1 * | 1/2012 | Morgan | 359/853 |
| 2012/0031463 A1 * | 2/2012 | Schmaelzle et al. | 136/246 |
| 2012/0099325 A1 * | 4/2012 | Ghosh et al. | 362/296.01 |
| 2012/0138047 A1 * | 6/2012 | Ashkin | 126/619 |
| 2012/0154941 A1 * | 6/2012 | Zalevsky et al. | 359/853 |

* cited by examiner

LIGHT COLLECTION SYSTEM AND METHOD

CROSS REFERENCE TO RELATED APPLICATIONS

This application is being filed with the United States Patent Office under 35 USC 371 as a national stage application of International Application Serial Number PCT/IL2010/00382 filed on May 13, 2010 and, claims priority through such International Application to the following United States Provisional Applications for patent: 61/178,070 filed on May 14, 2009 and 61/253,076 filed on Oct. 20, 2009, all of which are hereby incorporated by reference.

FIELD OF THE INVENTION

The present invention relates generally to the field of solar energy, and more specifically to methods and apparatus for efficient collection of solar energy.

BACKGROUND OF THE INVENTION

Solar energy has been used for thousands of years as a heat and light source. In the last few decades, solar heating of water has become popular in a number of countries. In view of the increasing political and financial costs of oil, coupled with the deleterious environmental impacts thereof, many alternative energy sources are being developed. Solar energy may be concentrated and converted into electrical energy and, the electrical energy, in turn may be stored and/or fed into an electric grid.

The concentration of solar light energy provides many useful advantages, such as efficient use of photovoltaic (PV) cells. Conventional optics using focusing lenses, Fresnel lenses or convex mirrors of various shapes with sun-tracking systems are in use in many places. These are sometimes applied in industrial PV solar fields. Systems without sun-tracking are typically non-concentrating or low-concentrating systems.

In solar PV fields, most collecting systems pose shading constraints, which limit the maximal system array positioning density, that is, the positioning of plurality of sub-systems, one relative to the other. Conventional solar PV panels are often installed on flat roofs, but are typically set tilted and arranged in spaced-apart rows.

Fluorescent solar energy collectors, which guide light energy through a side surface of a collector have been proposed. However, such collectors have the disadvantages of low efficiency, stability and cost.

Holographic optical elements have been considered in the past for replacement of conventional lenses for directing light towards photovoltaic cells in solar panel systems.

At high latitudes, such as in Northern Europe, flat and compound parabolic reflectors, for low factor concentration, have been added to solar photovoltaic modules and more commonly to thermal modules (where lighting uniformity constraints are relaxed).

WO2008013156I discloses a solar energy system which uses a light-guide solar panel (LGSP) to trap light inside a dielectric or another transparent panel, which propagates the light to one of the panel edges for harvesting by a solar energy collector, such as a photovoltaic cell. This allows for very thin modules whose thickness is comparable to the height of the solar energy collector. This eliminates eliminating the depth requirements inherent in traditional concentrated photovoltaic solar energy systems.

In WO20090064701, a device comprising a light guiding layer, optically coupled to a photocell is described. A plurality of surface features are formed on one of the surfaces of the light guiding layer. The surface features can comprise facets that are angled with respect to each other. Light incident on the surface of the light guide is redirected by the surface features and guided through the light guide by multiple total internal reflections. The guided light is directed towards a photocell.

WO20090065069 discloses, a display device comprising a light collection film and a photovoltaic device disposed on an edge of the collection film. The collection film has a plurality of light-turning features for redirecting light between the front and rear surface of the collection film and the photovoltaic device. In some embodiments, a light source is also disposed on an edge of the collection film and emits light which is turned by the light-turning features toward the display.

There is still a need to provide efficient solar energy collection systems, which can be economically disposed in a solar field.

SUMMARY OF THE INVENTION

It is an object of some aspects of the present invention to provide efficient solar energy collection systems and methods.

It is another object of some aspects of the present invention to provide efficient solar energy collection systems, which can be economically disposed in a solar field.

It is another object of some aspects of the present invention to provide a stationary optical element sub-system add-on for enhancing the performance of a stationary PV system comprising flat modules, where the enhancement may be measured by the yearly increase of the amount of light impinging on the PV modules, in comparison with a system without the add-on.

It is appreciated that the cost of such a stationary optical element sub-system add-on may be far less than the value of the added energy production.

Another object of the present invention is to provide the stationary optical element sub-system add-on which may fit conventional PV module installations. Another object is to provide new PV systems designed with the sub-system therein.

Another object of the present invention is to provide a solar PV system having a flat form factor appropriate for building integrated applications, the system having a small area light converter and a large surface optical system (window) for collecting and directing the light towards the converter.

In some embodiments of the present invention, improved methods and apparatus are provided for collection of solar energy.

In other embodiments of the present invention, a method and system is described for improved collection of solar energy.

Some embodiments of the present invention are directed to providing a stationary optical system comprising a light collecting apparatus adapted to combine and mix a) light from at least one light-guiding element; b) light from at least one refection-deflection element; and c) light from at least one reflection element, wherein the light collecting apparatus is disposed to direct the combined light towards at least one light receiving element, thereby increasing the uniformity and efficiency over a large solar light angular range.

Some further embodiments of the present invention are directed to light collection systems comprising at least one light receiving element, selected from the group consisting of: a window, a photovoltaic element, a heating element, a light guiding element and combinations thereof, and at least one light reflector-deflector element, each element comprising a front light receiving surface, a rear surface, and a transparent volume, disposed between the front light receiving surface and the rear surface, the transparent volume being of a higher refractive index than of its surrounding, wherein the transparent volume comprises an asymmetric pattern which is adapted to, is constructed and configured to:
  a) at least partially reflect light by internal reflection and direct the light within the element;
  b) reflect some light off said front light receiving surface;
  c) reflect, deflect and guide light within the light reflector-deflector element; and
  d) direct light through the front light receiving surface towards the at least one light receiving element.

Additionally, according to some further embodiments of the present invention, the asymmetric pattern includes at least one of:
  i. a difference in the nominal thickness of a first and a second side of the transparent layer;
  ii. a curved pattern formed on at least one of the surfaces;
  iii. a ridged pattern; and
  iv. a prismatic pattern formed on at least one of the surfaces.

Furthermore, according to some embodiments of the present invention, the pattern may be repetitive or non-repetitive.

Moreover, according to an embodiment of the present invention, the angle between the front light receiving surface and a front surface of the reflector-deflector element is in the range between 110 degrees and 150 degrees.

Additionally, according to an embodiment of the present invention, more than one collector elements are arranged in tandem.

Further, according to an embodiment of the present invention, the asymmetry is along one direction and the profile asymmetry is greater than 0.55.

Yet further, according to some further embodiments of the present invention, the asymmetry is along one direction and the profile asymmetry is less than 0.45.

Additionally, according to some further embodiments of the present invention, the light collection system further includes an additional layer disposed adjacent to the rear surface with an air gap between the layer and the rear surface, the layer being selected from the group consisting of a reflecting layer, a tilted layer and un-tilted layer relative to the front light receiving surface.

Additionally, according to some further embodiments of the present invention, the at least one of the surfaces of the reflector-deflector element is coated.

Moreover, according to some further embodiments of the present invention, the light collection system further includes a plurality of light reflector-deflector elements.

According to some further embodiments of the present invention, the plurality of light reflector-deflector elements units are arranged in several complementary directions.

Additionally, according to some further embodiments of the present invention, the at least one reflector-deflector element is positioned so that its front light receiving surface is distal to a light source, the element being further arranged to reflect light directed at it by light collecting elements, towards the light receiving element.

Furthermore, according to some further embodiments of the present invention, the light collecting elements have a reflective side and a deflective-reflective side and are arranged with a tilt with respect to the plane of the reflector-deflector element.

Additionally, according to some further embodiments of the present invention, the light collecting elements are adapted to controllably rotate with respect to a plane of the reflector-deflector element.

Moreover, according to some further embodiments of the present invention, the at least one reflector-deflector element includes a frame filled with an optical liquid.

According to some further embodiments of the present invention, the optical liquid includes at least one of water, mineral oil, a low chain length optical organic oligomer; an optical polymer and a mixture thereof.

Additionally, according to some further embodiments of the present invention, the at least one reflector-deflector element includes a ridged array including at least two types of pairs of surface correlated features.

Furthermore, according to some further embodiments of the present invention, the pairs of surface correlated features include nominal pair surfaces direction at opposite tilts relative to a nominal plane of the ridged array.

Some further embodiments of the present invention are directed to a method of light collection comprising:
  a) receiving light from at least one light source;
  b) collecting light from the at least one light source to form collected light by;
    i. at least partially reflecting the received light by internal reflection and directing the light within at least one light reflector-deflector element;
    ii. reflecting some of the received light off a front face of at least one light reflector-deflector element; and
    iii. reflecting, deflecting and guiding the received light within the at least one reflector-deflector element; and
  c) directing at least part of the collected light to at least one light receiving element.

The present invention will be more fully understood from the following detailed description of the preferred embodiments thereof, taken together with the drawings.

BRIEF DESCRIPTION OF THE DRAWINGS

The invention will now be described in connection with certain preferred embodiments with reference to the following illustrative figures so that it may be more fully understood.

With specific reference now to the figures in detail, it is stressed that the particulars shown are by way of example and for purposes of illustrative discussion of the preferred embodiments of the present invention only and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings.

In all the figures similar reference numerals identify similar parts.

DETAILED DESCRIPTION OF PREFERRED EMBODIMENTS

In the detailed description, numerous specific details are set forth in order to provide a thorough understanding of the invention. However, it will be understood by those skilled in the art that these are specific embodiments and that the present invention may be practiced also in different ways that embody the characterizing features of the invention as described and claimed herein.

Figure 1:
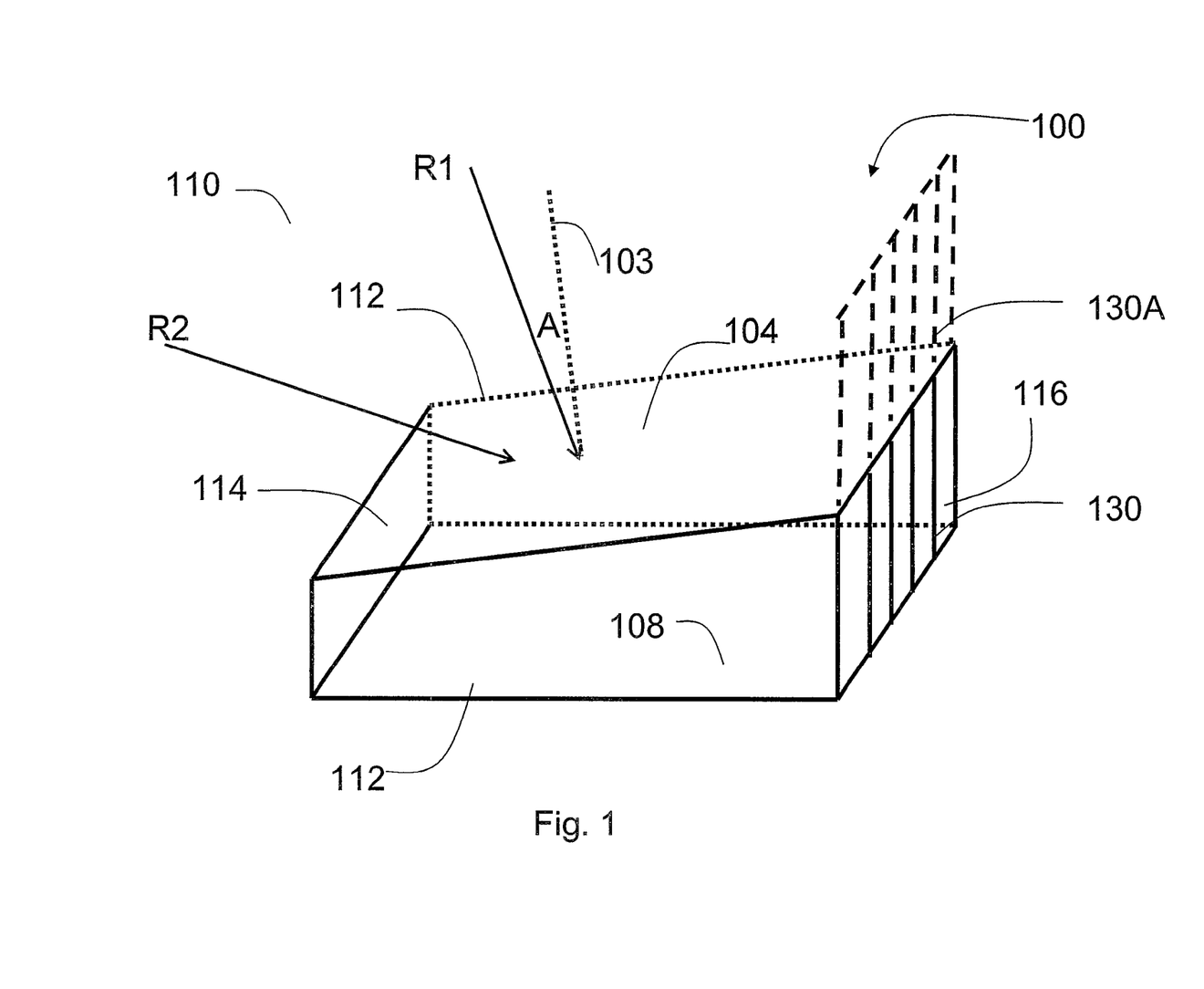
FIG. 1 is a simplified pictorial illustration showing a solar light collection element, in accordance with an embodiment of the present invention.

Reference is now made to FIG. 1, which is a simplified pictorial illustration showing a basic unit of a solar light collection and conversion system 100, comprising a light collector 110 and a light converter 130, in accordance with an embodiment of the present invention. As can be seen in FIG. 1, there is shown an embodiment of a basic "building block" solar light collection system, which is also termed "a reflector-deflector collector" or collector herein. In one embodiment of the invention, shown in FIG. 1, collector 110 is having a front face 104 and a back face 108, which may be reflective, side faces 112, which may also be reflective, and top and bottom faces 114 and 116 respectively. The collector 110 is wedged; the top side near face 114 being substantially thinner than the bottom side near face 116.

A converter 130 may be attached to the element bottom surface 116 or separated by an air gap. The converter 130 may be extended beyond the exit side 116 of the collector 110 to capture some of the reflected-deflected light, as indicated by the dashed extension 130A. The converter may be a standard photovoltaic solar module, a photovoltaic cell array tailored in size to the side of the collector and having heat sink attached thereto, a thermo-voltaic unit such as a heat pipe or (in spite of its name) a window, a light guide or, in general, another optical element to further direct the light.

Solar light direction is indicated by rays R1 and R2, schematically representing different solar elevations and azimuths (solar azimuth not shown). Angular incidence angles, A, are measured from the normal 103 to the front surface while solar angles are in reference to a horizontal surface.

Collector 110 acts on impinging light by several mechanisms, at small angular incidence angles (represented by ray R1) by diverting it towards a light receiving surface (a converter) 130, 130A, and on light impinging at large angular incidence angles (represented by ray R2) also by coupling the light into light guiding, to further direct the light towards a converter through an output coupler (emitting side which is the bottom side 116).

In all cases some of the light is reflected off the incidence surface 104. As is well known, reflection off surfaces (Fresnel reflection) is significant; few percent of the incident light impinges at small angles of incidence and a larger percent at much larger angles of incidence (close to grazing angles). In this embodiment and in the following embodiments, a significant portion of this reflected light (especially at large angles of incidence) is also directed towards converter 130, 130A.

The system can be positioned standing, half-standing or lying down. The light converter 130 (indicated by vertical lines) is, according to some embodiments, a photovoltaic element.

Side surfaces 112 may be reflective so as to direct the light towards a specific side, for example, a mirror with an air gap may be joined to surface 112.

Incidence surface 104 and back surface 108 may be coated with a coating with a (complex) refractive index, different from the refractive index of the volume of the element 110 and/or may be covered with a protective coating; controlling absorption at and reflection-off the surfaces and/or reducing dirt adhesion or even actively reducing it, (e.g. fluorinated polymer or Titanium oxide coatings) and/or improving durability.

Considering the interaction of the light with the basic unit few notes are made regarding the tradeoffs between the different forms of coupling light into and out of light guiding in a collector.

A light guide having a structure such as prismatic features or holographic/diffractive volumetric grating (at least at one of the surfaces) for coupling the light into light guiding instead of or in addition to having a wedged surface suffers from inherent losses of the guided light as the light interacts with such features at each pass through them.

For light guiding, the wedged collector 110 is optically superior to prior art systems because it can handle a large spectral range with low losses, at relatively low complexity. A system that does not direct these losses towards an energy converter, is inferior in this aspect, but may use these losses for other purposes such as lighting or display. However, controllably directing the light out of light guiding towards a specific direction requires an additional effort.

Figure 2:
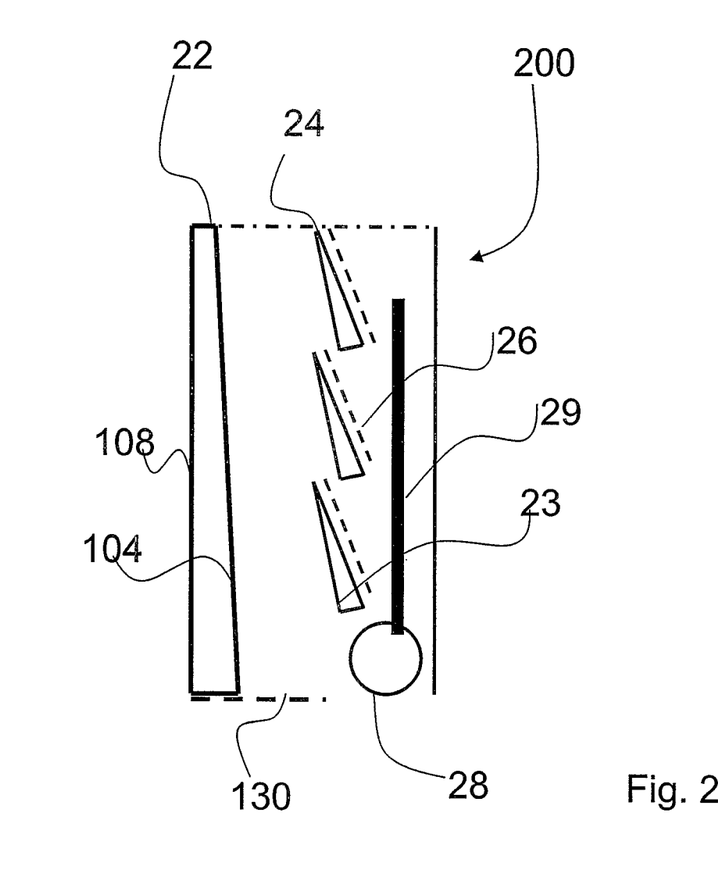
FIG. 2 is a simplified pictorial illustration of a solar collector system comprising at least two solar light collection elements, in accordance with an embodiment of the present invention.

Reference is now made to FIG. 2, which is a simplified pictorial illustration of a solar collector-converter system 200, in accordance with an embodiment of the present invention.

As is seen in FIG. 2, solar collector system 200 comprises at least two elements; (i) a first light guiding wedged element 22, similar or identical to collector 110 of FIG. 1, having a front surface 104 and a back surface 108 and (ii) a light reflecting element 24 serving to direct the light towards the wedged element 22 and a converter 130. Light reflecting element 24 enables the directing of the light by element 22 by light guiding, by reflection off the front surface 104 and by reflection-deflection off the back surface 108, through the volume of the element and off the front surface 104. In some embodiments, reflecting elements 24 also directs some of the light straight towards converter 130 without the mediation of element 22. Converter 130, e.g. a photovoltaic cell array may be coupled to the light guide 22 at its exit side and may be extended towards elements 24. It should be noted that the front face of element 22 is distal to the sun (the light source) and that elements 24 serve to precondition the light to being directed by reflector-deflector element 22.

A number of elements 24 may be arranged one above the other and at some tilt relative to the deflecting and light guiding element 22. Elements 24 may be arranged to minimize inter-shading and losses and actively tilted and moved by an actuator 29 (e.g. rotated) according to light direction so as to maximize directing by element 22 towards the converter 130. As light guiding substantially has a threshold, it is not very sensitive to the exact angle of the light directed at the element 22 and therefore is convenient to use it as a main light collection (directing) mechanism. Elements 24 may be rotated to maximize collection efficiency and to preferably select certain collection paths. Even if the elements 24 are actively rotated, the complete system 200 can be arranged within a protected stationary frame, protecting it from the ambient (e.g. humidity, dust, hail and/or temperature changes), thereby increasing system reliability.

Elements 24 are wedged elements, having a reflective rear surface 26, which may be double sided; i.e. reflecting light coming from the front side 23 through the wedge or light impinging on the back side 26. The advantage of such elements compared to the use of conventional mirror can be explained by considering the use of reflection, without deflection, e.g. by replacing elements 24 with flat mirrors and considering directing small angle light towards element 22 at angles that result in light guiding. Achieving this requires a large tilt (typically more than 25° with respect to the plane on the collector) of the (simple) reflector (the 24 substitute) and consequently may cause some of the light to be obscured by the reflective elements themselves. Using wedged reflectors (and reflection-deflection) enables reaching a large reflection-deflection of the light and increases the angular range of light that can be directed towards element 22 at angles that lead to light guiding at much lower tilt of the elements 22 and consequently much lower mutual obscuration losses.

It should be noted that elements 24 have characteristics similar to element 22 serving as secondary (and non-stationary) collectors which direct the light to a collector (instead of directing it at a converter), the different naming of elements 24 (as reflecting elements) serving mainly to identify their main function and add clarity.

In an embodiment, the wedge angle of element 22 is in the range 3°-7° and the wedge angle of element 24 is in the range 8°-12°. Light impinging at the surfaces of 22 at angle larger than approximately 65° is coupled into light guiding. Light passing through 22 and plane at angles of around 25° to 40° and approaching elements 24 which are (i) having the transparent face 23 facing element 22 (ii) approximately parallel to the wedge 22 nominal is impinging at the front face 23 and is reflected towards front face 104 at angles that lead to light guiding or are close to it.

Rays impinging at large angles (e.g. larger than 45° from the normal of the front surface 104) on wedged elements 24, passing through surface 23 may suffer total internal reflection within and may be not appropriately directed towards element 22. Using double sided reflective surfaces 26 enables the use of further rotation of the elements 24 so that the reflecting interface 26 is directed and used without having light passing through the prism-like section. This enables reflection of large angled rays at low tilt angle of the wedged elements 24.

The converter 130 may be extended in the direction of the elements 24. This enables directing the light by elements 24 (generally towards element 22) at angles larger than required for light-guiding coupling (closer to being parallel to the plane of the light guiding element) resulting in less efficient coupling of the back-reflected light into the light guide and larger complementing components that are either reflected from surface 104 or non-intersecting with it, both components subsequently impinging on the extended cell array 130.

The system may be packaged, with wedge 22 serving as the light interface and elements 24 and their rotation mechanism and controller 28, 29 being protected within a box allowing for a simple and lightweight internal tracking sub-system (not shown) without the need to actuate the whole system as is required in conventional solar concentrating system. The 'boxed' system can be installed in a similar way to the way in which conventional flat solar panels are installed.

In a conventional arrangement at a location such as a flat roof (far from the equator, e.g. at latitude 35°), an array of conventional flat modules is set with the modules facing south (north in the southern hemisphere) and tilted, typically at about 30°-50°. To prevent shading, there is an empty space between each row of modules. Such arrangement is economically more efficient then flat (horizontally) tiling of the same area with more modules, each used at a lower capacity (compared to its maximal power production capacity). The spaced rows arrangement leaves spaces between rows which, at certain hours during a day, are illuminated by the sun but the light impinging there is not collected and converted.

Figure 3:
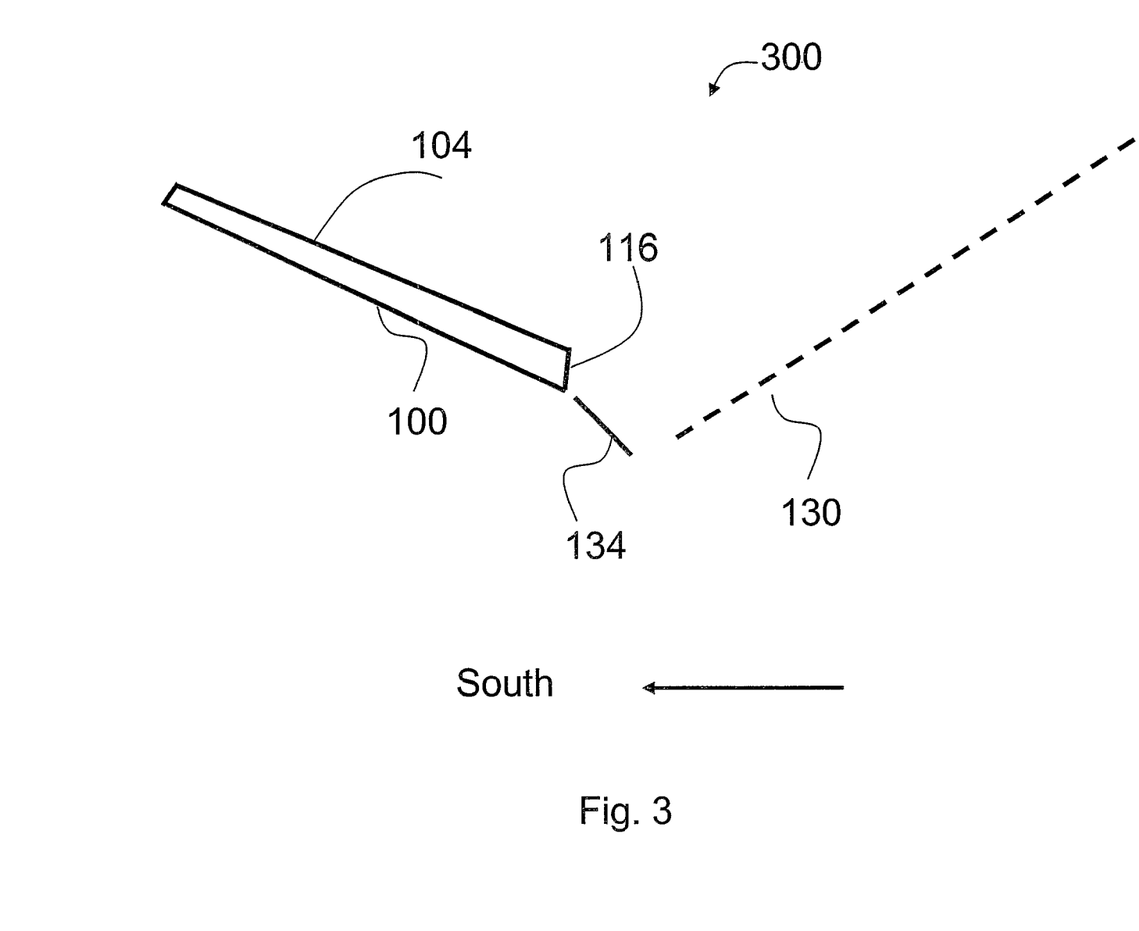
FIG. 3 is a simplified pictorial illustration of a solar light collection system comprising a light collection element spaced apart from a solar converter, in accordance with an embodiment of the present invention.

Reference is now made to FIG. 3, which is a simplified pictorial illustration of a solar light collection system 300 comprising a light collection element 110 spaced apart from a solar converter 130, in accordance with an embodiment of the present invention.

FIG. 3 shows a scheme of the use of a collector 110, wherein a solar cell array (a converter 130) is spaced apart from the collector. The collector, comprising at least one of sides 116 and 104, is constructed and configured to direct light towards a solar cell array 130. Additionally, a mirror 134 may be positioned between the collector and the solar module to reflect misdirected light coming from the light guide towards the solar modules. Alternatively, mirror 134 may be replaced by a reflector with controlled scattering, enhancing the uniformity of the light impinging at the converter. The unit arrangement of one converter and one collector may be extended deployment of several units in a row by deployment of several rows of PV converter modules wherein the collector elements are place in between. In this arrangement, the collector 110 is placed in a location where in conventional setting, a space is left free, thus on the one hand the solar modules are disposed far enough apart to eliminate shading, and, on the other hand, light impinging at this previously a dead space between rows of modules is not lost but at least partially directed to the solar modules.

In an alternative embodiment, an array of PV modules is arranged on a tilted roof which is, in general, facing the sun (facing south in the northern hemisphere) and an array of collectors is added and set on an oppositely tilted and previously unexploited adjacent roof, not necessarily at the same level or tilt, directing light from the previously unexploited roof towards a conventionally exploited roof (or a similar arrangement) increases the throughput of the conventional system.

A pattern (not shown) formed at the emitting edge of the light guide 116 may be used to increase the output coupling efficiency and/or to control the output light angular range in either directions (lateral and transversal) of the emitting side and/or to homogenize light so as to direct it more efficiently towards the photovoltaic modules next to the collector. The conditioning of the output coupling side can be achieved for example by control of the tilt of the collector, of the angle of the emitting side (relative to the wedge nominal plane), by forming a reflective near the emitting side and/or by forming a pattern e.g. of appropriate prism like facets, sinusoidal or lenticular like surfaces. Optionally, V-like prismatic features or round lenticular like lenslets may be formed (in either transverse or lateral direction). Alternatively, features which resemble pyramids projecting off the surface of the emitting side may be used.

The directed and homogenized light is the light either reflected off the front (proximal) face 104, reflected by the back (distal) face 108 or reflecting layer coupled thereto (not shown), and emitted off the front facet, or guided and emitted from light guide out-coupling surfaces 116.

Selection of the wedge angle and the material of the collector takes into account the effective wedge angle experienced by light impinging at different time of the day and the year; as the wedge axis may be laying (flat or tilted) along a north-south direction, light at morning or evening would experience a much smaller effective wedge. Typically wedge angle is in the range of 2° to 20°, more typically around 10°.

The collector may have a convex front surface pattern. The surface is designed taking into account, inter alia, the solar position throughout the day and the year, wedge thickness and collector tilt. The surface structure works via several mechanisms to control the angular range of the distribution of the light going out of the surfaces of the collector, towards the cell array. Other more complex surfaces such as semi-parabolic may be used in conjunction with the wedge light guiding feature of the collector to improve its efficiency.

Embodiments in accordance with some of the objectives, comprising stationary add-ons collectors and conventional modules at different arrangements are now described.

In one embodiment of the present invention, exemplified in FIG. 3, collector elements can be set in the spaces between rows of conventional solar modules tilted at 30° to 50° facing south or north, the collectors tilted at opposite sign angles (north when the converter is facing south and vice versa), at angles ranging from 10° to 60°; the light is directed to a converter by light guiding and/or reflection-deflection (off the rear surfaces) and/or reflection (off the front surfaces). Reflection-deflection by the appropriate elements of the collector enables directing of the exiting light at controlled angles towards the light converter. The added deflection allows more light at an extended angular range, which is proportional to the amount of deflection to be directed at the converter.

For the wedged element and for light impinging at it, once the light is internally reflected (coupled into light guiding), the interaction of the surfaces of the guiding wedge with the guided rays increases the angles of guided rays so that the probability of guiding, even if the surfaces are non-perfect increases, and also does increase the distance between impingements at the interfaces.

In general more than one collector element may be arranged in tandem; having a second element front surface adjacent to the rear surface of a first element, thereby enabling the directing and guiding of light that was not efficiently directed by a single element. The elements in tandem may be different one from the other and may be parallel or (slightly) tilted one to the next.

The converter and the collector can be arranged at distance one from the other, thereby standard solar modules may be used as converters whereas the collectors act as improvement or 'add-on' boosters.

Figure 4:
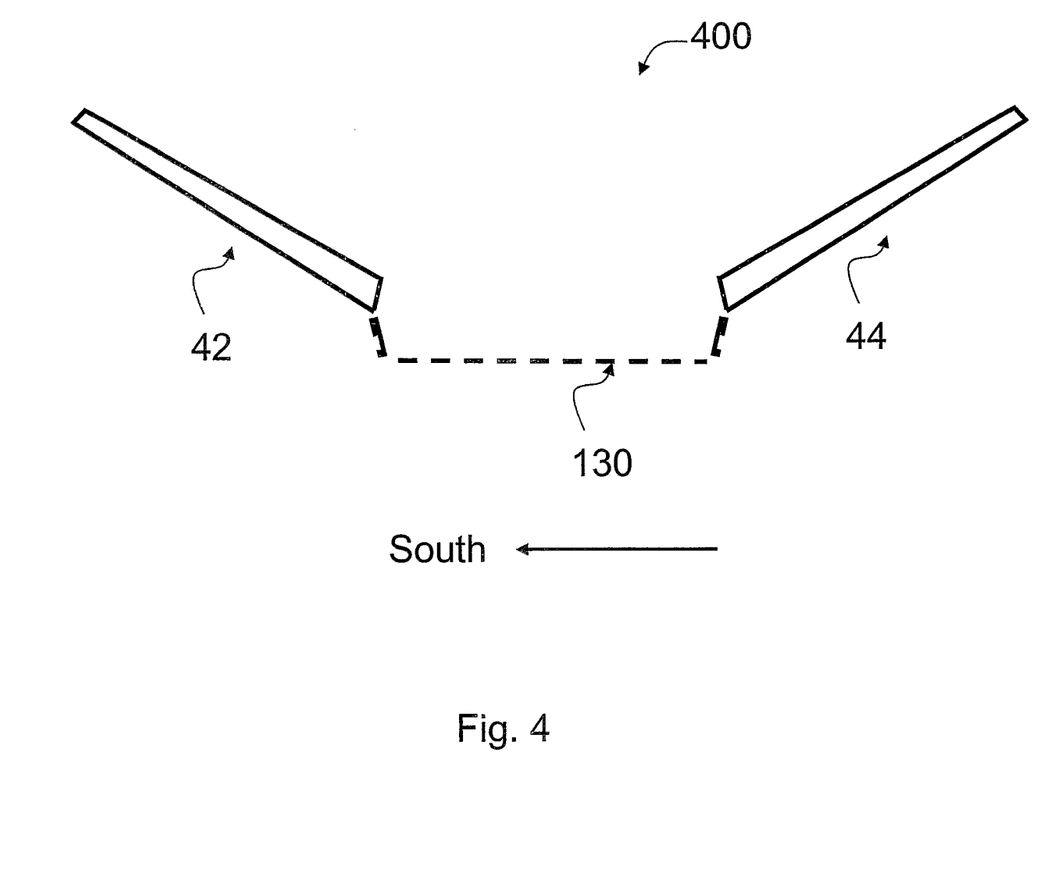
FIG. 4 is a simplified pictorial illustration of an equatorial solar light collection system comprising an arrangement of collectors, in accordance with an embodiment of the present invention.

Reference is now made to FIG. 4, which is a simplified pictorial illustration of an equatorial solar light collection system 400 comprising an arrangement of collectors, in accordance with an embodiment of the present invention. Using inexpensive moldable polymeric material and manufacturing technology allows for the shaping of the collector surfaces as different two dimensional manifolds. In near-equator settings, solar position shifts from south to north at noon, depending on the time of the year. Embodiments using collector 110 of FIG. 1, may provide large improvements in converter utilization, compared to prior art conventional flat panel laying (horizontal) or tilted arrangements.

In one embodiment portrayed in FIG. 4, collectors 42 and 44, which may be similar or identical to wedged collector 110 of FIG. 1, are set (tilted) north and south to a solar panel 130 respectively. The collectors on both sides are efficient throughout the most of the day and throughout the year and provide better usage of the solar panels. Collectors at the east west directions and/or at other orientations may also be used.

In general, collector units may be arranged in several complementary directions wherein at different times of the day or year different sets of collectors work with higher efficiency to direct the light onto the converter.

Figure 5:
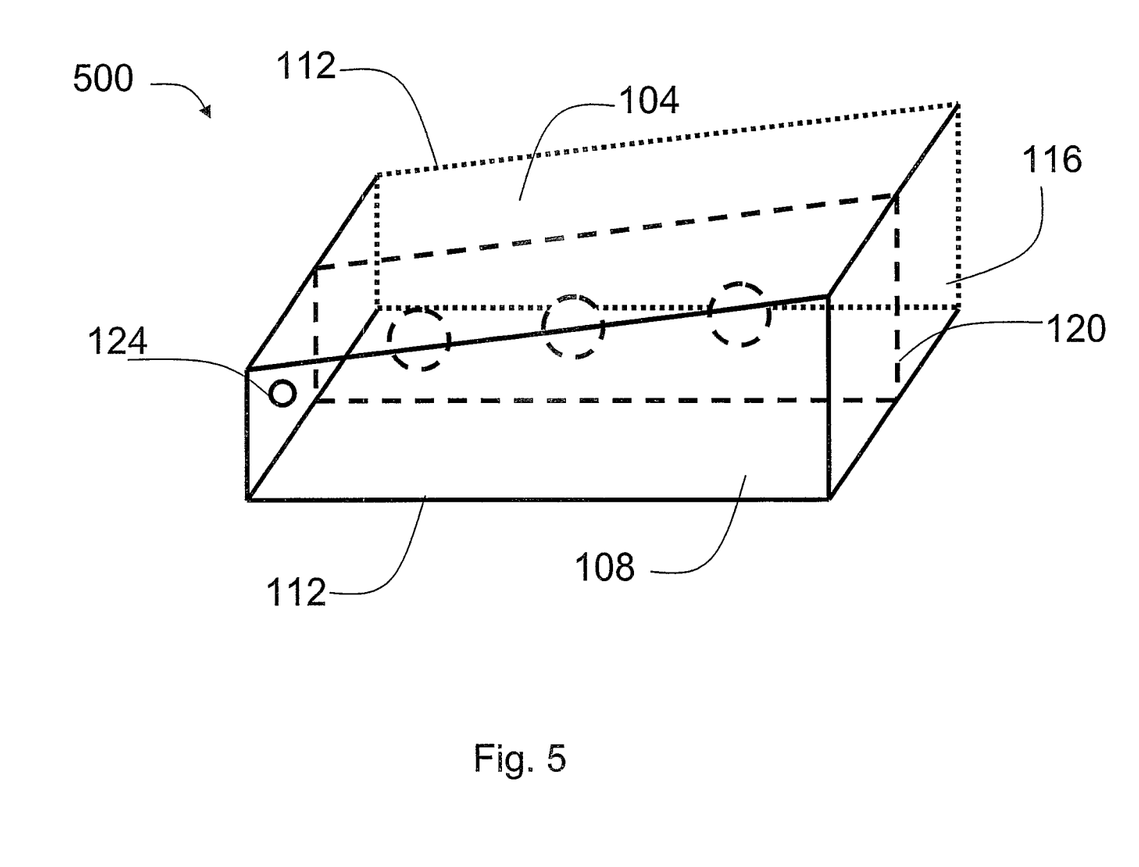
FIG. 5 is a simplified pictorial illustration of a structure of a solar energy collector comprising an optical liquid, in accordance with an embodiment of the present invention.

Reference is now made to FIG. 5, which is a simplified pictorial illustration of a structure of a solar energy collector 500 comprising an optical liquid, in accordance with an embodiment of the present invention;

The collector, in its application to solar systems, may comprise a transparent volume made of any material fit for exposure to ambient conditions for the times typical for solar installations; glass, acryl and polycarbonate are typical examples. However, production of large monolithic wedged collectors of controlled optical quality may become an issue in terms of the required amount of material, and the production resources (time, work and machinery).

FIG. 5 depicts a side view of an alternative wedged collector comprising a polymer frame and being filled with an optical liquid. The collector 500 having (1) a front plate 104, having surface which may be patterned, (2) a back plate 108 which may be reflective and patterned, (3) side plates 112 which may be reflective and patterned, (4) an emitting edge 116 which may be fitted directly to a photovoltaic cell array or be designed to emit in the direction of a converter arrangement, the emitting edge may be tilted and/or patterned, (5) optionally, one or more inner frames 120 which may be made of an optical polymer may be constructed to reinforce the structure.

An inner frame 120 is depicted with openings allowing flow of an optical liquid. The optical liquid may be filled into the collector through sealable opening 124. The optical liquid is preferably transparent in the spectral range appropriate for the photovoltaic cell spectral response range; water, glycerol, propylene glycol, mineral oil, organic oligomers or (organic) polymers such as acrylic oligomers, or mixtures thereof are optional examples. The optical liquid is preferably having a high refractive index and may also comprise additives that would enhance its performance over a long time period. The reflector used at the rear surface 108 may be inserted within the frame relaxing the assembly constrains (for example in this case the back plate does not need to be transparent). Alternatively, the reflector may form a layer on the back plate or be separated from the back polymer surface by an air gap. Liquid flow within the light guide as a result of heat gradients may enable better temperature control by heat convection. The plates comprising the frame may be bent to form a mechanically stronger structure and improve the collection efficiency.

The collectors described herein, such as collectors 110, 500 may be of dimensions 1-2 meters in length and of similar widths.

Incorporating (or allowing) into the system some optical imperfections in terms of distortion of the light path such as slight refractive index variability (within the volume of the element), surface deformation or controlled scattering may positively affect system performance as it may positively affect light distribution at the converter.

In an alternative embodiment a thin optical element (compared to the wedged element) is used.

Figure 6:
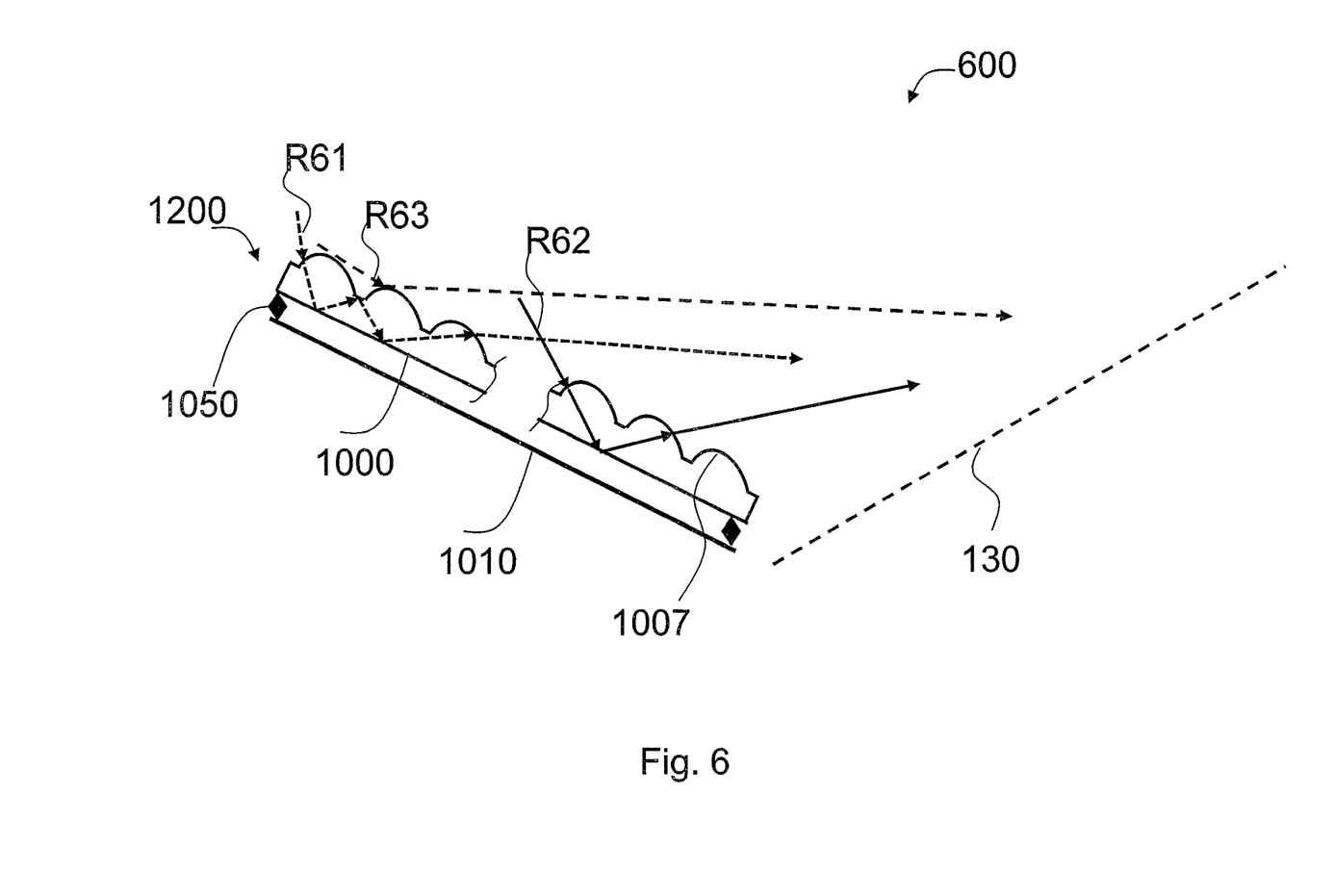
FIG. 6 is a simplified pictorial illustration of a system comprising a collector element with a curved asymmetric pattern, in accordance with an embodiment of the present invention.

FIG. 6 is a simplified pictorial illustration of a system 600 comprising an element 1000 with a curved asymmetric pattern, in accordance with an embodiment of the present invention.

Reference is made to FIG. 6 illustrating a cross section of system 600, wherein a collector 1200 comprises a principle optical element 1000 is patterned substantially as a lenslet array 1007 at least at one of the surfaces, the lenslet or lenslet array being asymmetric with respect to at least one main direction (this can be checked by verifying that no more than one plane of reflection symmetry, orthogonal to the nominal element surface, exists, for the lenslet or lenslet array). Rays R61 and R62 portrayed in FIG. 6, illustrate that in addition to reflection off the front surface of element 1000 (portrayed by R63), light is directed towards converter 130 either by light guiding (and subsequent controlled out-coupling) or by reflection (total internal reflection in this case) and deflection.

Rays R61 and R62 portray that the light directing is non-imaging and that it is more appropriate to consider the lenslet like pattern in terms of non-imaging properties. It may be convenient in some cases to consider the curved structure as a wedge with a varying wedge angle.

An additional layer 1010 may optionally be added below the rear surface of element 1000 to handle light that has not been reflected (by internal reflection) at the rear surface of element 1000. Layer 1010 may be a reflective surface (e.g. a coated glass mirror) or having a white pattern, a bump pattern or a fine groove pattern enabling refection or diffuse reflection of the passing light towards the lenslet array and towards the receiving (converter) element. Alternatively, layer 1010 may be an additional element similar to element 1000. Layer 1010 may be separated from element 1000 by spacers 1050 to form an air gap of controlled size.

The asymmetric lenslet pattern having one plane of reflection symmetry may be characterized by a measure of the asymmetry. In specific embodiments, the profile asymmetry is larger than 0.55 or smaller than 0.45, and preferably larger than 0.6 or smaller than 0.4, and more preferably larger than 0.7 or smaller than 0.3, whereas the profile asymmetry is measured by the ratio between subsequent distances of minima and maxima at the lenslet surface profile along a line parallel to the plane of symmetry, the ratio calculated according to $d/(x_{min}^i, x_{max}^i)/d(x_{max}^i, x_{max}^{i+1})$, whereas $d(y,z)$ denotes the distance between points y and z, $x_{max}^i(x_{max}^i)$ denotes the maximum (or minimum) location in the i-th repeating unit in the pattern. If the minimum or maximum are a set of more than one point, e.g. in case the minimum is flat and parallel to the nominal surface of the element, then the minimum or maximum points are defined as the middle point (s) of the relevant section(s) of the cross section of the lenslet profile (that is the middle between the first minimum (or maximum) point and the last minimum (or maximum) point in the respective section of the profile of the elementary unit). A more general asymmetry of the collector would bear if the collector is set in asymmetry with respect to solar position and motion through out the year, e.g. partially facing east or west.

In one embodiment, converters 130 are PV panels and are facing south (typically denoted by orientation of 180°) at tilt angles between 25° and 50°, and collectors 1200 of similar area (and few mm thick) are oppositely positioned facing north tilted at angles between 30° and 50°. Depending on the latitude and the time of year, the sun at noon may be at elevation angles similar to the tilt of the collector and the solar light's cross section with the face of the collector would be very small. It is appreciated that for such collector arrangements the collection of radiation directed from large azimuth angles (east and west) has a significant effect on the collection efficiency.

In an embodiment, the pattern is a lenticular like pattern forming a curved profile only in one direction. In an alternative embodiment the pattern at, at least one of the surfaces of the element 1000 is convex or prismatic or carrying a repetitive convex pattern a second direction, thereby increasing the collection efficiency of light directed from large azimuth angles. In an embodiment this pattern is symmetric, providing one plane of reflection symmetry. In an additional embodiment, the basic "lenslet" unit curvature is involving a more complex relation between the curvature in the first and the second directions.

As is disclosed in the embodiments of the present invention, light guiding is combined with the use of features for directing the light out of the collector towards the converter. This is instead of prior art systems using only light guiding in a transparent layer. These features for controlled leakage (coupling the light out of light guiding) may be for example prismatic features, curved surfaces, bumps or white regions. The features are used not only to couple the light in or out of transparent layer but also to direct it towards the converter.

Figure 7A:
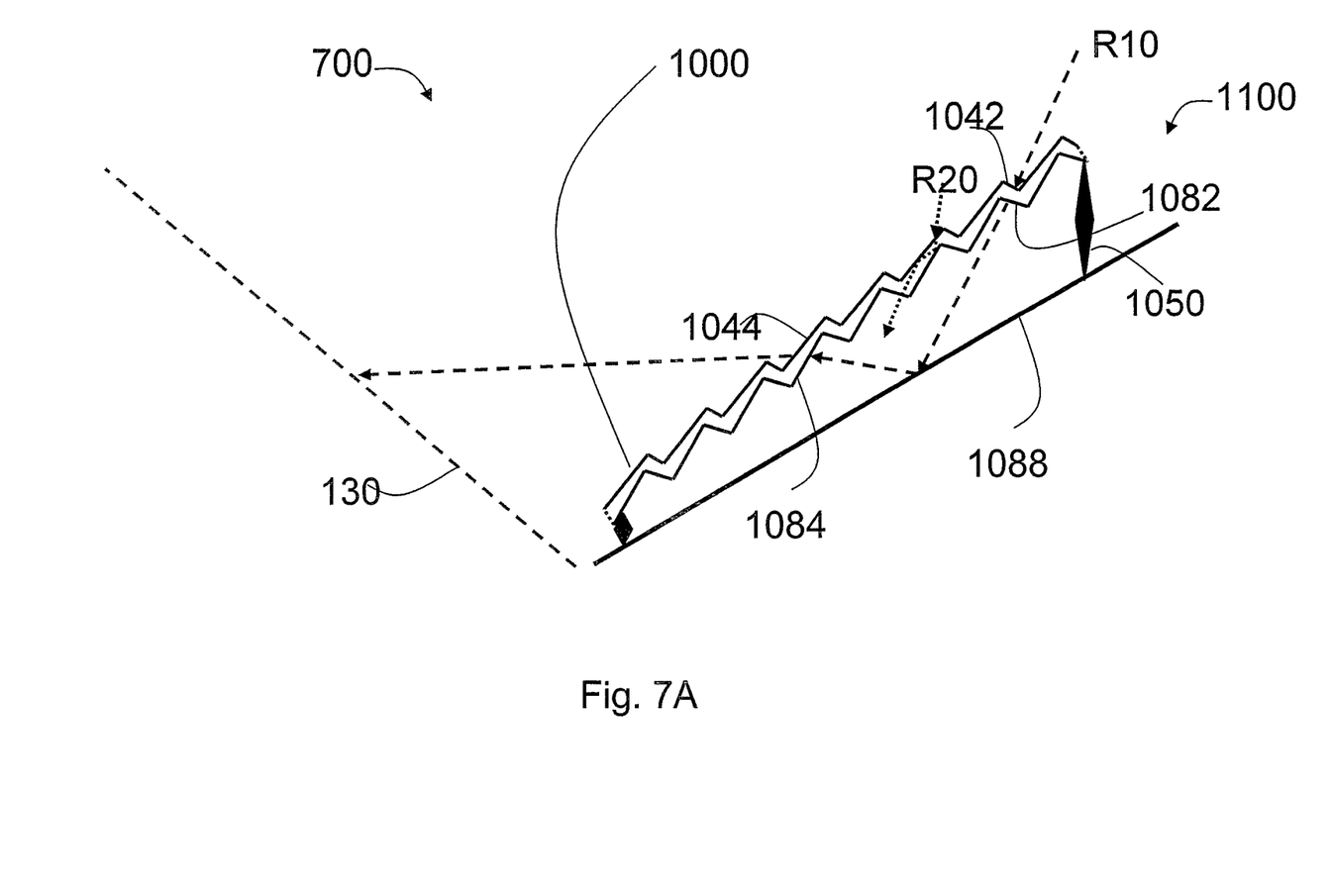
FIG. 7A is a simplified pictorial illustration of a system comprising a ridged array based collector, in accordance with an embodiment of the present invention.
Figure 7B:
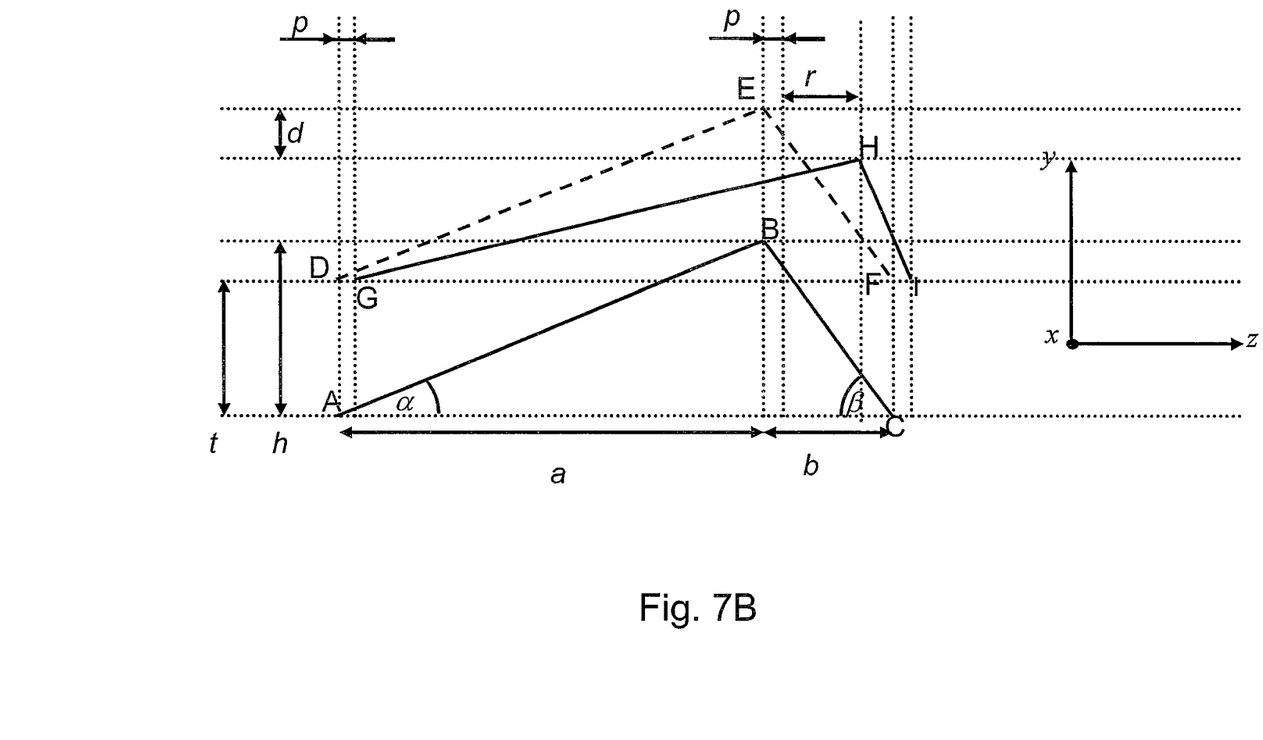
FIG. 7B is a simplified pictorial illustration showing details of a basic unit of the ridged array of FIG. 7A.

FIG. 7A and FIG. 7B show a schematic cross section of an embodiment of a collector system 1100 comprising ridged array element and of a basic (repeating) unit.

FIG. 7A shows the cross section of a light deflection/reflection element 1100 comprising a translucent or transparent plate with ridges 1000 correlated on both sides. There are two types of pairs of surfaces correlations; surfaces 1042 paired and matched with surfaces 1082 and surfaces 1044 paired and matched with surfaces 1084. The nominal tilt of the first surface pair (relative to the nominal plane or ridged array) is of opposite sign to the nominal tilt of the second surface pair. In this embodiment, both pairs of surfaces are correlated so that the within each pair the distance between the surfaces is such that the thickness of the element is larger closer to the converter.

FIG. 7B shows a basic repeating unit of the ridged array which may be parameterized by its length, by the angles alpha, $\alpha$, and beta, $\beta$, and by the offsets t, d, p and r. However, the structure parameters may also be a function of the relative position in the array, for example providing more deflection in one region. Example values are L=20 mm, $\alpha$=17°, $\beta$=33°, t=0.8, d=0.4, r=0.3 and p=0.05, where t, d, r and p are offsets relative in size to L.

Referring again to FIG. 7A, rays R10 (dashed arrows) and R20 (dotted arrows) illustrate the use of the optical element 1000 in the system. Ray R10 is impinging at surfaces 1042 and 1082 and is being deflected towards reflecting surface 1088 which is at tilt to the nominal ridged array plane where as this tilt may be controlled by spacers 1050. As a result, further reflection-deflection is provided and the light impinges at surfaces 1084 and 1044. As these surfaces tilted one respect to the other the ray is further deflected and is being directed to the converter 130. Ray R20 illustrates another path in which some light guiding accrues between surfaces of type 1044 and 1084. However, at certain stage, the ray impinges at a surface of type 1082 at a low angle (relative to the normal) and the ray is out coupled and proceeds towards the reflector, having now a higher probability of being directed towards the converter. Light guiding of a ray, as is referred to herein, is defined by having a ray path of more than one (total) internal reflection within the transparent volume of the element 1000 before being out coupled.

Optionally, element 1000 may be protected by cover plate and/or supported on a transparent plate forming a mechanically stiffer structure. The transparent plates and/or the reflecting surface may comprise additional features such as diffusers or lenticular arrays and the system may be slightly bent for improved mechanical and/or optical performance. The addition of surfaces implies additional Fresnel reflections which may be used to control the light profile at the converter.

The references cited herein teach many principles that are applicable to the present invention. Therefore the full contents of these publications are incorporated by reference herein where appropriate for teachings of additional or alternative details, features and/or technical background.

It is to be understood that the invention is not limited in its application to the details set forth in the description contained herein or illustrated in the drawings. The invention is capable of other embodiments and of being practiced and carried out in various ways. Those skilled in the art will readily appreciate that various modifications and changes can be applied to the embodiments of the invention as hereinbefore described without departing from its scope, defined in and by the appended claims.

The invention claimed is:

1. A light collection system for solar light collection and conversion comprising:
    several rows of tilted photo-voltaic (PV) convertor modules spaced from each other at a certain distance;
    several rows of stationary solar light collector elements placed in between the rows of the PV convertors in locations wherein a space is left free, the solar light collector elements tilted to direct the light to the PV convertors and wherein each solar light collector includes at least one solar light reflecting and one solar light deflecting element, directing the solar light impinging at large and small angles at the space left free between rows of modules, to the PV convertors and enhancing the uniformity of the solar light directed from the solar light collector to the PV convertor.

2. The light collection system according to claim 1, wherein the solar light collector element is a transparent wedged volume and having a top side that is substantially thinner than a bottom side.

3. The light collection system according to claim 1, wherein the solar light collector element further includes a front face, a back face, and a plurality of side faces and wherein the back face, and the side faces are reflective.

4. The light collection system according to claim 1, wherein the solar light collector element acts on solar light impinging on it at small angular incidence angles solar light by diverting the solar light towards a light receiving surface of a solar convertor and on solar light impinging at large angular incidence angles by coupling the solar light into light guiding, to further direct the light towards the solar light convertor and wherein the solar light reflected off incidence surface is directed to the solar light convertor.

5. The light collection system according to claim 1, wherein the solar light collector elements further comprise patterned optical elements, and wherein light is directed towards the solar light convertors by reflection off the front surface of elements, by light guiding and subsequent controlled out-coupling, and by total internal reflection and deflection.

6. The light collection system according to claim 1, wherein the solar light collector element further comprises a patterned optical element, and wherein the pattern is at least one of a group of patterns consisting of a lenslet array, an asymmetric lenslet array, a prismatic pattern, and a curved structure with a varying wedge angle, with asymmetry larger than 0.55 and smaller than 0.45 and wherein the asymmetry of the pattern is measured by ratio between subsequent distances of minima and maxima at the pattern elements along a line parallel to a plane of symmetry.

7. The light collection system according to claim 1, wherein the solar light collector element further comprises a patterned optical element, and wherein the pattern is at least one of a group of patterns consisting of a lenslet array, an asymmetric lenslet array, a prismatic pattern, and a curved structure with a varying wedge angle, with asymmetry larger than 0.55 and smaller than 0.45 and wherein the asymmetry of the pattern is measured by ratio between subsequent distances of minima and maxima at the pattern elements along a line parallel to a plane of symmetry and wherein at least one of surfaces of the solar light collector element is convex, or prismatic or carrying a repetitive convex pattern in a second direction.

8. The light collection system according to claim 1, wherein the solar light collector element further comprises a patterned optical element, and wherein the pattern is at least one of a group of patterns consisting of a lenslet array, an asymmetric lenslet array, a prismatic pattern, and a curved structure with a varying wedge angle, with asymmetry larger than 0.55 and smaller than 0.45 and wherein the asymmetry of the pattern is measured by ratio between subsequent distances of minima and maxima at the pattern elements along a line parallel to a plane of symmetry and wherein the solar light collector element further comprises an additional layer below the rear surface of said patterned optical element to handle the solar light that has not been reflected by the rear surface and wherein the layer is at least one of a group of a reflective surface such as a coated glass mirror, a layer having a white pattern, a layer having a bump pattern, a layer having a fine groove pattern and a transparent plate, enabling refection or diffuse reflection of the passing light towards the convertor element.

9. The light collection and conversion according to claim 1, wherein the solar light collector comprises a patterned surface and a cover plate that protect said patterned surface of the solar light collector element and wherein the cover plate together with the solar light collector form a mechanically stiffer structure.

10. The light collection system according to claim 1, wherein the solar light collector element further comprises an asymmetric optical elements.

11. The light collection system according to claim 1, wherein the solar light collector element further comprises an asymmetric optical element and wherein the solar light collector element is set in asymmetry with respect to solar position and motion throughout a year, such as partially facing East or West.

12. The light collection system according to claim 1, wherein the solar light collectors are tilted at angles ranging from 10 degree to 60 degree and wherein the solar light collector tilt angle is opposite to tilt angle of the solar light convertors.

13. The light collection system according to claim 1, wherein the angle between a front light receiving surface of the solar light convertor and a front surface of the reflector-deflector element is in the range between 110 degrees and 150 degrees.

14. A method for solar light collection and conversion comprising:
- providing several rows of stationary tilted conventional photo-voltaic (PV) convertor modules spaced from each other at a certain distance and several rows of solar light collector elements placed in between the rows of the PV convertor modules in locations wherein a space is left free; and
- collecting and directing the solar light impinging at large and small angles at the space left free between rows of modules, directing the collected light to the PV convertors and enhancing the uniformity of the solar light impinging at the convertor.

15. The method for solar light collection and conversion according to claim 14, wherein collecting solar light from the solar light source includes combining and mixing:
- solar light from at least one light-guiding element;
- solar light from at least one refection-deflection element; and
- solar light from at least one reflection element; and
- disposing a light collector to direct the combined light towards at least one solar light convertor receiving surface, further increasing uniformity and efficiency over a large solar light angular range.

16. The method for solar light collection and conversion according to claim 14, wherein the solar light collector element acts on impinging on it at small angular incidence angles solar light by diverting the solar light towards a light receiving surface of the light convertor and on solar light impinging at large angular incidence angles by coupling the solar light into light guiding, and further directing the light towards the convertor.

* * * * *